United States Patent
Ma et al.

(10) Patent No.: US 11,971,457 B2
(45) Date of Patent: Apr. 30, 2024

(54) METHOD FOR MEASURING AC IMPEDANCE OF BATTERY IN COMPOSITE POWER SUPPLY POWER SYSTEM

(71) Applicant: TONGJI UNIVERSITY, Shanghai (CN)

(72) Inventors: Tiancai Ma, Shanghai (CN); Yanbo Yang, Shanghai (CN); Kaihang Song, Shanghai (CN); Weikang Lin, Shanghai (CN); Naiyuan Yao, Shanghai (CN)

(73) Assignee: TONGJI UNIVERSITY, Shanghai (CN)

( * ) Notice: Subject to any disclaimer, the term of this patent is extended or adjusted under 35 U.S.C. 154(b) by 89 days.

(21) Appl. No.: 17/519,577

(22) Filed: Nov. 5, 2021

(65) Prior Publication Data

US 2022/0155377 A1   May 19, 2022

(30) Foreign Application Priority Data

Nov. 19, 2020 (CN) .......................... 202011304030.3

(51) Int. Cl.
*G01R 31/389* (2019.01)
*G01R 31/367* (2019.01)
*G01R 31/385* (2019.01)
*H02J 3/00* (2006.01)
*H02J 3/38* (2006.01)

(52) U.S. Cl.
CPC ......... *G01R 31/389* (2019.01); *G01R 31/367* (2019.01); *G01R 31/385* (2019.01); *H02J 3/003* (2020.01); *H02J 3/38* (2013.01); *H02J 2300/30* (2020.01)

(58) Field of Classification Search
CPC ..... G01R 31/389; G01R 31/367; H02J 3/003; H02J 3/38
See application file for complete search history.

(56) References Cited

U.S. PATENT DOCUMENTS

| 2009/0226770 A1* | 9/2009 | Manabe ............ H01M 8/04947 429/431 |
| 2015/0232083 A1* | 8/2015 | Yu ......................... B60W 10/06 701/53 |

FOREIGN PATENT DOCUMENTS

| JP | 2019079631 A | * 5/2019 |
| WO | 2008149830 | 12/2008 |

OTHER PUBLICATIONS

Po Hong, "Water Content Estimation and Control of PEM Fuel Cell Stack and the Individual Cell in Vehicle", China Doctoral Dissertations Full-text Database, Engineering Science and Technology I, Issue 6, Jun. 15, 2020, pp. 1-37.

(Continued)

*Primary Examiner* — John C Kuan
(74) *Attorney, Agent, or Firm* — JCIP GLOBAL INC.

(57) ABSTRACT

The present invention relates to a method for measuring the AC impedance of a battery in a composite power supply power system, comprising the following steps: determining the AC disturbance signal amplitude, operating the DC/DC voltage converter to generate the AC disturbance signal, collecting the output signals of the fuel cell and the lithium battery, calculating the output power of the fuel cell and the lithium battery; calculating the demand power of the load, and when the demand power is stable, calculating the impedance of the lithium battery and the fuel cell separately, otherwise, only the impedance of the fuel cell is calculated.

10 Claims, 3 Drawing Sheets

(56) References Cited

OTHER PUBLICATIONS

Wan Kuntu, "Study In Energy Management Strategy Of Extended Range Vehicle Based On Particle Swarm Optimization Algorithm", China Master's Theses Full-text Database, Engineering Science and Technology II, Issue 8, Aug. 15, 2016, pp. 1-94.

"Office Action of China Counterpart Application", dated Jun. 3, 2021, p. 1-p. 11.

* cited by examiner

METHOD FOR MEASURING AC IMPEDANCE OF BATTERY IN COMPOSITE POWER SUPPLY POWER SYSTEM

CROSS-REFERENCE TO RELATED APPLICATION

This application claims the priority benefit of China application serial no. 202011304030.3, filed on Nov. 19, 2020. The entirety of the above-mentioned patent application is hereby incorporated by reference herein and made a part of this specification.

BACKGROUND

Technical Field

The present invention relates to the field of battery testing technology, in particular, to a method of AC impedance measurement of batteries in a composite power supply power system

Description of Related Art

As the energy and environmental problems become more and more serious, the excessive consumption of traditional fossil energy has caused people to worry about energy depletion, and the development and utilization of new energy has received widespread attention, especially in the field of new energy vehicles, fuel cells and lithium batteries have become the new trend of development. However, the dynamic response of fuel cell is slow, and independent use will not be able to meet the frequent power changes under automotive conditions, while lithium battery has high power density and fast response rate, so a composite power system combining fuel cell and lithium battery is a better solution. The internal state of both fuel cell and lithium battery cannot be directly obtained through measurement, which will bring greater difficulties to the control, safety monitoring and fault diagnosis of the vehicle composite power system.

In the prior art, the internal state of the battery is generally identified by measuring the electrochemical AC impedance of the battery and based on this, fault diagnosis analysis is performed. However, the composite power system includes fuel cell and lithium battery. Since the load demand power will change during the operation of the vehicle, the fuel cell and lithium battery will adjust the output current accordingly, and it is necessary to install AC impedance measurement devices for the two batteries separately in order to measure the AC impedance of the two batteries. Considering the cost and volume problems, the vehicle is generally installed only one AC impedance measurement device, using the device to measure the AC impedance of the fuel cell, using other devices or complex control methods to identify the internal state of the lithium battery, it is difficult to integrate the identification of the internal state of the composite power system.

SUMMARY

After the inventor's analysis and research, it is found that when the vehicle is running stably, the demand power of the load is unchanged, at this time, the AC disturbance signal is applied to the fuel cell through the DC/DC voltage converter, the output signal of the fuel cell is the superposition of DC signal and sinusoidal alternating signal, and the power changes, in order to keep the power input to the load unchanged, the lithium battery also adjusts its power, and when the adjustment process is finished, the output signal of the lithium battery is also adjusted to the superposition of DC signal and sinusoidal alternating signal, and the impedance of the lithium battery can be calculated according to the sinusoidal alternating signal. The purpose of the present invention is to provide an AC impedance measurement method of the battery in the composite power system, adding the step of detecting whether the load demand power is stable in the existing control method, and when the load demand power is stable, the vehicle's own AC impedance measurement device can be used to measure the impedance of the fuel cell and the lithium battery at the same time, reducing the difficulty of identifying the internal state of the composite power system, greatly reducing the cost, and being able to integrate the identification of the internal state of the composite power system.

The purpose of the present invention can be achieved by the following technical solutions.

A method for AC impedance measurement of a battery in a composite power supply power system, measuring the impedance of a fuel cell and a lithium battery based on an AC impedance measurement device, comprising the following steps:

S1: determining the amplitude of the AC disturbance signal, the control system controlling the DC/DC voltage converter to work to generate the AC disturbance signal, the output signal of the fuel cell changing, and the output signal of the lithium battery changing accordingly, said output signal including the current signal and the voltage signal.

S2: real-time acquisition of the current signal and voltage signal of the fuel cell, real-time acquisition of the current signal and voltage signal of the lithium battery, and calculation of the real-time output power of the fuel cell and the lithium battery, respectively.

S3: calculating the real-time demand power P load demand of the load according to the real-time output power of the fuel cell and the lithium battery, and calculating the real-time change rate of P load demand, and if the real-time change rate of P load demand is less than the preset stability threshold, executing step S4, otherwise, calculating the impedance of the fuel cell, and waiting for the preset time length T1 before executing step S5.

S4: calculating the impedance of the fuel cell and the lithium battery respectively, waiting for the preset time length T2 and then executing step S5.

S5: the control system obtains an impedance measurement control signal, and if the control signal is an end signal, ends the impedance measurement, otherwise, executes step S1.

Further, in said step S1, the amplitude magnitude of the AC disturbance signal is determined according to the disturbance signal amplitude of the fuel cell and the disturbance signal amplitude of the lithium battery, including the following steps:

S11: determining the amplitude range $[\lambda 1, \lambda 2]$ of the perturbation signal of the fuel cell based on the impedance measurement accuracy demand and the DC output signal of the fuel cell S12: determining the amplitude range $[\lambda 3, \lambda 4]$ of the lithium battery perturbation signal based on the impedance measurement accuracy demand and the DC output signal of the lithium battery.

S13: If there is no intersection between $[\lambda 1, \lambda 2]$ and $[\lambda 3, \lambda 4]$, the DC/DC voltage converter operates to adjust the DC output signals of the fuel cell and the lithium battery, and step S11 is repeated, otherwise, a value is selected from the intersection of [λ1, λ2] and [λ3, λ4] as the amplitude of the AC perturbation signal.

Further, said step S11, the amplitude range [λ1, λ2] of the fuel cell perturbation signal is specified as [a*2%, a*10%], wherein a represents the DC output signal of the fuel cell.

Further, said step S12, the amplitude range [λ3, λ4] of the lithium battery perturbation signal is specifically [b*2%, b*10%], wherein b represents the DC output signal of the lithium battery.

Further, said step S2, the real-time acquisition of the current signal and the voltage signal of the fuel cell is specifically: the acquisition of the current signal $I_{fuelcell}$ and the overall voltage signal $V_{fuelcell}$ of the fuel cell, the acquisition of the voltage signal $V_{fuelcellp}$ of the single fuel cell to be measured, $0<p<n+1$, n being the number of single cells in the fuel cell; the real-time acquisition of the current signal and the voltage signal of the lithium battery is specifically: the acquisition of the current signal $I_{lithium}$ and the overall voltage signal $V_{lithium}$ of the lithium battery, the acquisition of the voltage signal $V_{lithiumq}$ of the single lithium battery to be measured, $0<q<m+1$, m being the number of single cells in the lithium battery.

Further, in said step S3, the real-time demand power $P_{loaddemand}$ of the load is calculated by the formula $$P_{loaddemand} = P_{DCDC-out} + P_{lithiumbattery}$$

$$P_{DCDC-out} = \eta P_{DCDC-in}$$

$$P_{DCDC-in} = P_{fuelcell}$$

Wherein, $P_{loaddemand}$ is the real-time demand power of the load, $P_{DCDC-out}$ is the output power of the DC/DC voltage converter, $P_{lithiumbattery}$ is the output power of the lithium battery cell, η is the conversion efficiency of the DC/DC voltage converter, $P_{DCDC-in}$ is the input power of the DC/DC voltage converter, and $P_{fuelcell}$ is the output power of the fuel cell.

Further, said step S3 in which the pre-set stabilization threshold is 1%.

Further, said step S3 and step S4, the formulae for calculating the fuel cell impedance, the single fuel cell impedance to be measured, the lithium battery impedance and the single lithium battery impedance to be measured are specifically:

$$Z(\omega) = \frac{V_A}{I_A} e^{j(\theta_1 - \theta_2)}$$

$$V(t) = V_D + V_A \sin(\omega t + \theta_1)$$

$$I(t) = I_D + I_A \sin(\omega t + \theta_2)$$

Wherein Z(ω) represents the impedance, V(t) represents the collected voltage signal, $V_D$ represents the DC voltage signal in the collected voltage signal, $V_A$ represents the AC voltage signal in the collected voltage signal, I(t) represents the collected current signal, $I_D$ represents the DC current signal in the collected voltage signal, $I_A$ represents the AC current signal in the collected voltage signal, ω represents the frequency of the AC signal, t represents the time, and $\theta_1$ and $\theta_2$ represent the initial phases of the AC voltage signal and the AC current signal, respectively.

Further, said step S3, the pre-set time length T1 is 2 seconds.

Further, said step S4, the pre-set time length T2 is 5 seconds.

Compared with the prior art, the present invention has the following beneficial effects:

(1) The step of detecting whether the load demand power is stable is added to the existing control method, and when the load demand power is stable, the impedance of the fuel cell and lithium battery is obtained by using the vehicle's own AC impedance measurement device to measure simultaneously, which reduces the difficulty of identifying the internal state of the composite power system and greatly reduces the cost, and enables the internal state of the composite power system to be identified integrally.

(2) The magnitude of the disturbance signal is determined according to the range of the disturbance signal of the fuel cell and the range of the disturbance signal of the lithium battery, taking into account both the impedance measurement accuracy and the stability of the battery, and the magnitude of the selected disturbance signal is more reasonable.

(3) In the process of signal acquisition, if the rate of change of load demand power is less than 1%, the vehicle is considered to be running smoothly and the impedance of fuel cell and lithium battery can be calculated at the same time; if the rate of change is more than 1%, the vehicle is considered to be running unstably and the impedance of fuel cell is calculated only according to the collected data.

(4) When the rate of change of load demand power is less than 1%, the vehicle is considered to be running smoothly, and the battery state changes slowly under more stable conditions, so wait for 5 seconds before making the next measurement. When the rate of change of load demand power is more than 1%, the internal state of the battery changes faster and the measurement frequency needs to be increased, so wait for 2 seconds before making the next measurement, and the impedance data obtained from the measurement is more representative.

DETAILED DESCRIPTION OF DISCLOSED EMBODIMENTS

The present invention is described in detail below in conjunction with the accompanying drawings and specific embodiments. This embodiment is implemented with the technical solution of the present invention in mind, and the detailed implementation and specific operation process are given, but the scope of protection of the present invention is not limited to the following embodiments.

Figure 2:
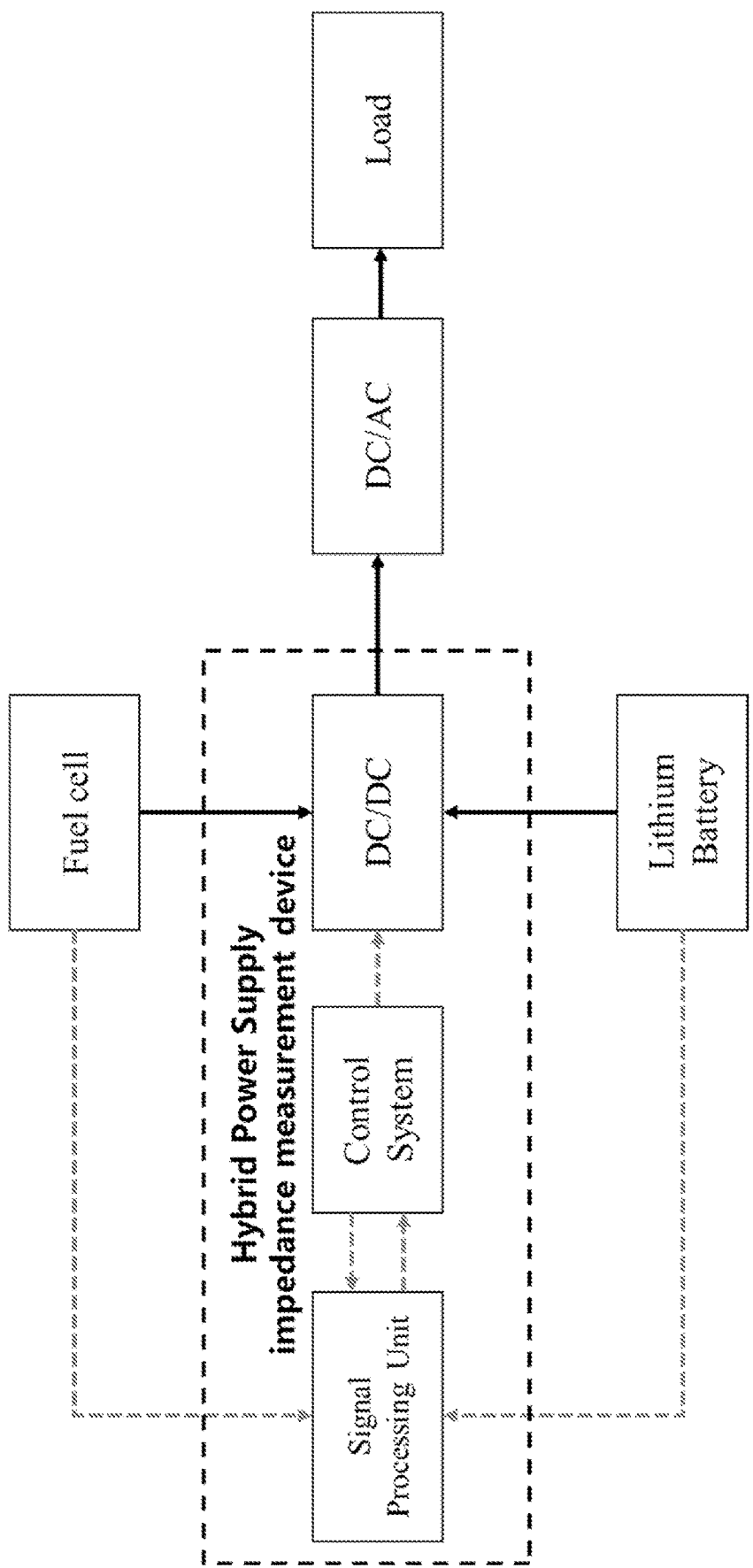
FIG. 2 is a schematic diagram of the structure of the composite power supply power system in the embodiment.

The structure of a composite power supply power system for a new energy-powered vehicle is shown in FIG. 2, including a fuel cell and a lithium battery, during the operation of the vehicle, the load demand power will change, and the fuel cell and lithium battery will then adjust the output current, taking into account the cost and volume issues, only an AC impedance measurement device is installed, and the AC impedance of the fuel cell is measured using this device, making it difficult to integrate Identify the internal state of the composite power system. In the prior art, the impedance of the fuel cell is calculated directly by applying an AC disturbance signal to the fuel cell through a DC/DC voltage converter, without considering the state of the lithium battery.

After the inventor's analysis and research, it is found that when the vehicle is running stably, the demand power of the load is unchanged, at this time, the AC disturbance signal is applied to the fuel cell through the DC/DC voltage converter, the output signal of the fuel cell is the superposition of DC signal and sinusoidal alternating signal, and the power changes, in order to keep the power input to the load unchanged, the lithium battery also adjusts its power and has the same fluctuation form as the fuel cell power, and there is a linear relationship between the output power of the lithium battery and the output power of the fuel cell, as follows:

$$P_{loaddemand} = P_{DCDC-out} + P_{lithiumbattery} =$$
$$\eta P_{DCDC-in} + P_{lithiumbattery} = \eta P_{fuelcell} + P_{lithiumbattery}$$

Where $P_{loaddemand}$ is the real-time demand power of the load, $P_{DCDC-out}$ is the output power of the DC/DC voltage converter, $P_{lithiumbattery}$ is the output power of the lithium battery cell, $\eta$ is the conversion efficiency of the DC/DC voltage converter, $P_{DCDC-in}$ is the input power of the DC/DC voltage converter, and $P_{fuelcell}$ is the output power of the fuel cell.

Because the lithium battery under small fluctuations can be considered as a linear system, when the adjustment process is over, the output signal of the lithium battery is also adjusted to the superposition of the DC signal and the sinusoidal alternating signal, and the impedance of the lithium battery can be calculated based on this sinusoidal alternating signal.

The present invention adds the step of detecting whether the load demand power is stable to the existing control method, and when the load demand power is stable, the vehicle's own AC impedance measuring device can be used to measure the impedance of both the fuel cell and the lithium battery, which reduces the difficulty of identifying the internal state of the composite power supply power system, greatly reduces the cost, and can integrate the identification of the internal state of the composite power supply system.

Figure 1:
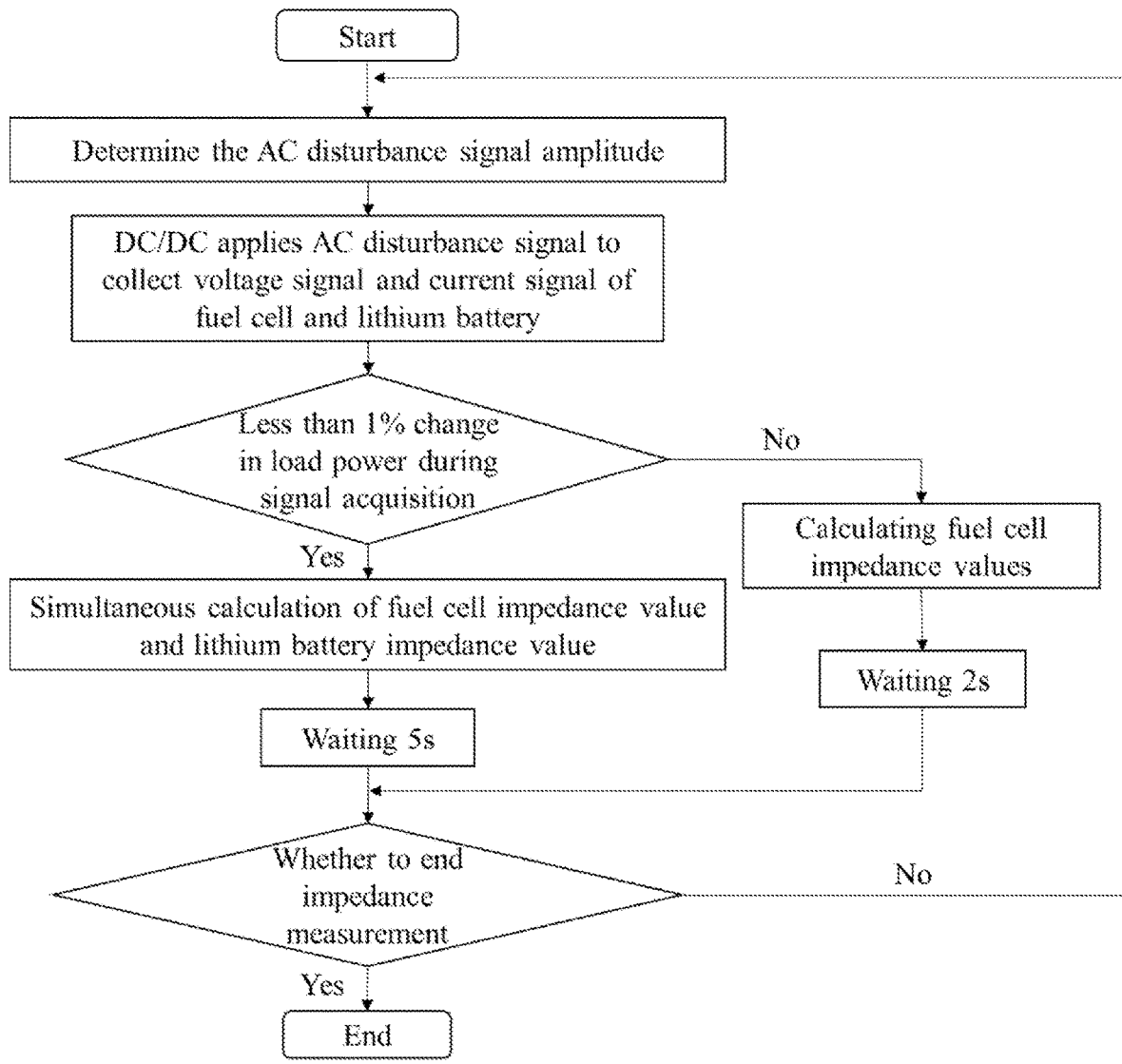
FIG. 1 shows the flow chart of the present invention.

A method for AC impedance measurement of a battery in a composite power supply power system, based on the AC impedance measurement device to measure the impedance of a fuel cell and a lithium battery, as shown in FIG. 1, comprising the following steps:

A method for AC impedance measurement of a battery in a composite power supply power system, measuring the impedance of a fuel cell and a lithium battery based on an AC impedance measurement device, comprising the following steps:

S1: determining the amplitude of the AC disturbance signal, the control system controls the DC/DC voltage converter to work to generate the AC disturbance signal, the output signal of the fuel cell is changed, and the output signal of the lithium battery is changed accordingly, said output signal includes a current signal and a voltage signal.

The magnitude size of the AC disturbance signal is determined according to the disturbance signal magnitude of the fuel cell and the disturbance signal magnitude of the lithium battery, comprising the steps of:

S11: determining the amplitude range [λ1, λ2] of the fuel cell perturbation signal based on the impedance measurement accuracy demand and the DC output signal of the fuel cell.

S12: determining the amplitude range [λ3, λ4] of the lithium battery perturbation signal based on the impedance measurement accuracy demand and the DC output signal of the lithium battery.

S13: If there is no intersection between [λ1, λ2] and [λ3, λ4], the DC/DC voltage converter operates to adjust the DC output signals of the fuel cell and the lithium battery and repeat step S11, otherwise, a value is selected from the intersection of [λ1, λ2] and [λ3, λ4] as the amplitude of the AC perturbation signal.

In this embodiment, the amplitude range of the fuel cell perturbation signal is [a*2%, a*10%], wherein, a represents the DC output signal of the fuel cell; the amplitude range of the lithium battery perturbation signal is [b*2%, b*10%], wherein, b represents the DC output signal of the lithium battery; if the perturbation signal amplitude is too large, it will lead to instability of the battery system and meaningless measurement results, and if the perturbation signal A small amplitude will lead to a small signal-to-noise ratio and poor measurement accuracy. After comprehensive consideration, the output signal of the fuel cell and the output signal of the lithium battery are adjusted to approximate values by the DC/DC voltage converter, and the perturbation signal amplitude is selected in the overlapping part of [λ1, λ2] and [λ3, λ4]. In other implementations, the amplitude range of the perturbation signal can be adjusted according to the accuracy needs.

S2: The current signal and voltage signal of the fuel cell are collected in real time, and the current signal and voltage signal of the lithium battery are collected in real time, and the real time output power of the fuel cell and the lithium battery are calculated respectively.

Real-time acquisition of the current signal and voltage signal of the fuel cell is specifically: acquisition of the current signal $I_{fuelcell}$ and the overall voltage signal $V_{fuelcell}$ of the fuel cell, acquisition of the voltage signal $V_{fuelcellp}$ of the single fuel cell to be measured, 0<p<n+1, n is the number of single cells in the fuel cell; real-time acquisition of the current signal and voltage signal of the lithium battery is specifically: acquisition of the current signal $I_{lithium}$ and the overall voltage signal $V_{lithium}$ of the lithium battery, acquisition of the voltage signal $V_{lithiumq}$ of the single lithium battery to be measured, 0<q<m+1, m is the number of single cells in the lithium battery.

Figure 3:
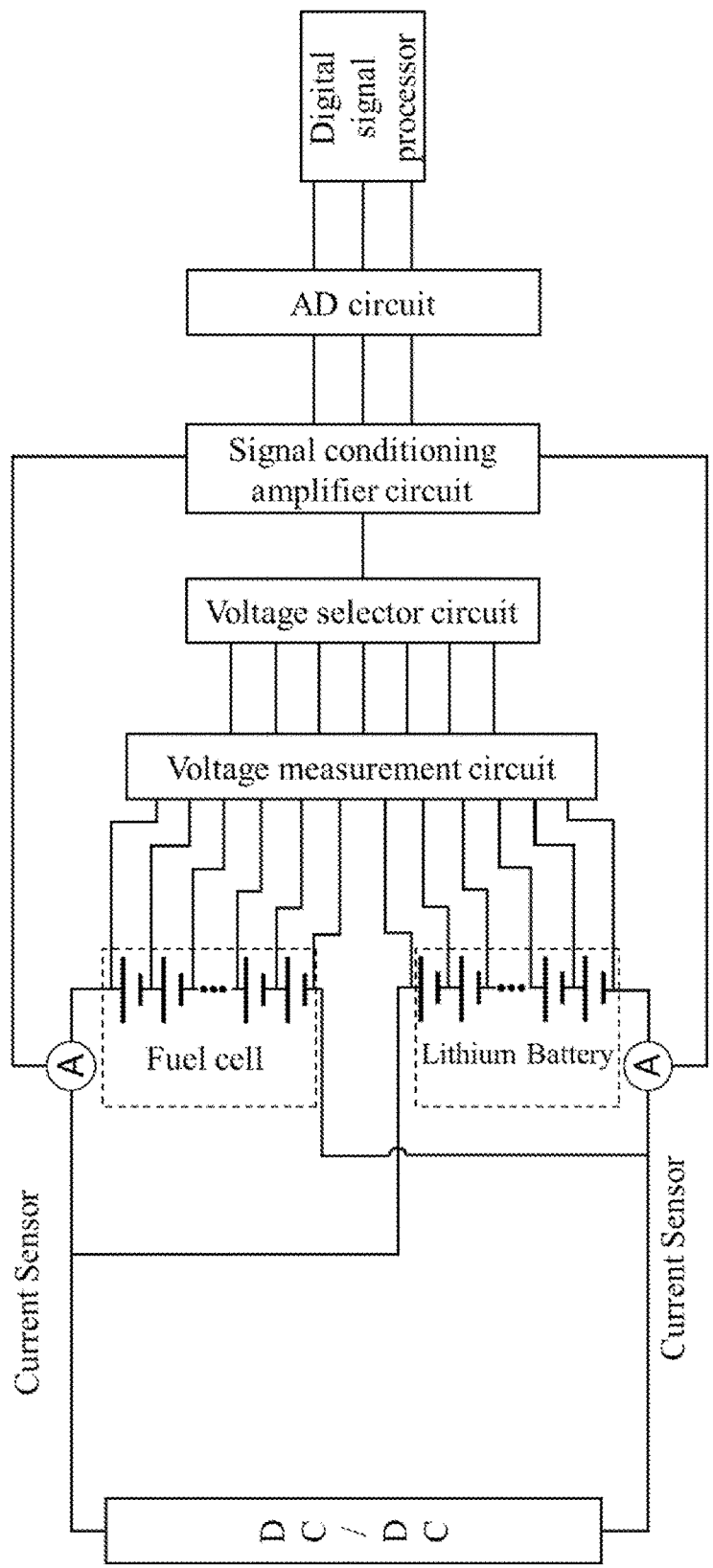
FIG. 3 is a schematic diagram of the structure of the AC impedance measurement device in the embodiment.

As shown in FIG. 3, both the fuel cell and the lithium battery include multiple single cells, and it is necessary to calculate not only the impedance of the whole cell, but also the impedance of the single cell to identify the state of the single cell.

The collected current signal of the fuel cell $I_{fuelcell}$ and the current of each individual fuel cell are the same and do not need to be collected repeatedly. A voltage measurement circuit is provided on each individual fuel cell, and a voltage signal selector circuit is used to select the voltage signal of the individual fuel cell/whole fuel cell that needs to be measured. The collected signal is conditioned and amplified by the signal conditioning and amplification circuit, and then the voltage and current signal is converted from analog to digital by the analog-to-digital conversion circuit and input to the digital signal processor.

The collected current signal of the lithium battery $I_{lithium}$ and the current of each single lithium battery is the same, there is no need to collect multiple times, each single lithium battery is equipped with a voltage measurement circuit, and the voltage signal selection circuit is used to select the voltage signal of the single lithium battery/overall lithium battery that needs to be measured. The collected signal is conditioned and amplified by the signal conditioning and amplification circuit, and then the voltage and current signal is converted from analog to digital by the analog-to-digital conversion circuit and input to the digital signal processor.

S3: calculate the real-time demand power $P_{loaddemand}$ of the load based on the real-time output power of the fuel cell and the lithium battery, and calculate the real-time change rate of $P_{loaddemand}$, and if the real-time change rate of $P_{loaddemand}$ is less than the preset stability threshold, then execute step S4, otherwise, calculate the impedance of the fuel cell, and wait for the preset time length T1 before executing step S5.

The structure of the AC impedance measurement device is shown in FIG. 3. The fuel cell is connected to the input of the DC/DC voltage converter, the output of the DC/DC voltage converter is connected to the input of the DC/AC voltage converter in parallel with the lithium battery, and the output of the DC/AC voltage converter is connected to the load. Therefore, the input power size of the DC/DC voltage converter is the output power size of the fuel cell. Since the conversion efficiency of the DC/DC voltage converter fluctuates weakly, it can be considered that η is a constant value, and the sum of the output power of the DC/DC voltage converter and the output power of the lithium battery is the input power of the DC/AC voltage converter, which is also equal to the demand power of the load.

Therefore, the real-time demand power $P_{loaddemand}$ of the load is calculated by the formula $$P_{loaddemand} = P_{DCDC-out} + P_{lithiumbattery}$$

$$P_{DCDC-out} = \eta P_{DCDC-in}$$

$$P_{DCDC-in} = P_{fuelcell}$$

Where $P_{loaddemand}$ is the real-time demand power of the load, $P_{DCDC-out}$ is the output power of the DC/DC voltage converter, $P_{lithiumbattery}$ is the output power of the lithium battery cell, η is the conversion efficiency of the DC/DC voltage converter, $P_{DCDC-in}$ is the input power of the DC/DC voltage converter, and $P_{fuelcell}$ is the output power of the fuel cell.

Since the demand power of the load can change at any time during vehicle operation, it is also necessary to determine whether the demand power of the load fluctuates significantly during the signal acquisition process before calculating the impedance. In fact, when measuring the impedance in the high frequency band, the whole measurement process takes only a few seconds or even a few milliseconds, and the smaller the change in the load demand power, the more reliable the impedance measurement results are. In this embodiment, the pre-set stability threshold is 1%, and if the calculated rate of change of load real-time demand power exceeds 1%, the impedance of the lithium battery is no longer calculated based on the output signal of the lithium battery, and only the impedance of the fuel cell is calculated.

In this embodiment, the pre-set time length T1 is 2 seconds. When the rate of change of load demand power exceeds 1%, the internal state of the battery changes faster and the measurement frequency needs to be increased, so wait for 2 seconds for the next measurement, and the impedance data obtained from the measurement is more representative.

S4: Calculate the impedance of fuel cell and lithium battery respectively, and wait for the pre-set time length T2 before executing step S5.

The calculation of impedance is implemented in the digital signal processor, and the calculation formulas for the fuel cell impedance, the single fuel cell impedance to be measured, the lithium battery impedance and the single lithium battery impedance to be measured are specified as $$Z(\omega) = \frac{V_A}{I_A} e^{j(\theta_1 - \theta_2)}$$

$$V(t) = V_D + V_A \sin(\omega t + \theta_1)$$

$$I(t) = I_D + I_A \sin(\omega t + \theta_2)$$

Where $Z(\omega)$ represents the impedance, V(t) represents the collected voltage signal, $V_D$ represents the DC voltage signal in the collected voltage signal, $V_A$ represents the AC voltage signal in the collected voltage signal, I(t) represents the collected current signal, $I_D$ represents the DC current signal in the collected voltage signal, $I_A$ represents the AC current signal in the collected voltage signal, ω represents the frequency of the AC signal, t represents the time, and $\theta_1$ and $\theta_2$ represent the initial phase of the AC voltage signal and the AC current signal, respectively.

In this embodiment, the pre-set time length T2 is 5 seconds. When the rate of change of load demand power is less than 1%, the vehicle is considered to be running smoothly, and the battery state changes slowly in a more stable situation, so wait for 5 seconds before making the next measurement.

S5: The control system obtains the impedance measurement control signal, and if the control signal is the end signal, the impedance measurement is ended, otherwise, step S1 is executed.

After calculating the impedance of the fuel cell, single fuel cell, lithium battery and single lithium battery, the state integration identification, safety monitoring and fault diagnosis of the fuel cell and lithium battery, such as the system water content of the fuel cell, the operating temperature and health status of the lithium battery, can be realized based on the impedance value, the corresponding characteristic parameters and the impedance spectrum model of the two batteries.

The above describes in detail a preferred specific embodiment of the present invention. It should be understood that a person of ordinary skill in the art can make many modifications and variations according to the conception of the present invention without creative labor. Therefore, any technical solution that can be obtained by logical analysis, reasoning or limited experiments based on the prior art by a person skilled in the art in accordance with the idea of the present invention shall be within the scope of protection determined by the claims.

What is claimed is:

1. A method for measuring AC impedance of a battery in a composite power supply power system, wherein an impedance of a fuel cell and an impedance of a lithium battery are respectively measured based on an AC impedance measurement device, comprising the steps of:

S1: determining an amplitude of an AC disturbance signal, a control system controlling a DC/DC voltage converter to work to generate the AC disturbance signal, an output signal of the fuel cell changing, and an output signal of the lithium battery changing accordingly, each of said output signals including a current signal and a voltage signal;

S2: real-time acquiring the current signal and the voltage signal of the fuel cell, real-time acquiring the current signal and the voltage signal of the lithium battery, and respectively calculating a real-time output power of the fuel cell and a real-time output power of the lithium battery;

S3: calculating a real-time demand power $P_{loaddemand}$ of a load according to the real-time output power of the fuel cell and the real-time output power of the lithium battery, and calculating a real-time change rate of the real-time demand power $P_{loaddemand}$, and if the real-time change rate of the real-time demand power $P_{loaddemand}$ is less than a preset stability threshold, executing step S4, otherwise, calculating the impedance of the fuel cell, and waiting for a preset time length T1 before executing step S5;

S4: calculating the impedance of the fuel cell and the impedance of the lithium battery respectively, waiting for a preset time length T2 and then executing step S5; and S5: the control system obtaining an impedance measurement control signal, and if the control signal is an end signal, ending the impedance measurement, otherwise, executing step S1.

2. The method for measuring AC impedance of a battery in a composite power supply power system according to claim 1, wherein in said step S1, a size of the magnitude of the AC disturbance signal is determined according to an amplitude of a disturbance signal of the fuel cell and an amplitude of a disturbance signal of the lithium battery, the step S1 comprising the steps of:

S11: determining an amplitude range [λ1, λ2] of the disturbance signal of the fuel cell based on an accuracy demand of the impedance measurement and a DC output signal of the fuel cell;

S12: determining an amplitude range [λ3, λ4] of the disturbance signal of the lithium battery based on the accuracy demand of the impedance measurement and a DC output signal of the lithium battery;

S13: If there is no intersection between the amplitude range [λ1, λ2] and the amplitude range [λ3, λ4], the DC/DC voltage converter works to adjust the DC output signals of the fuel cell and the DC output signal of the lithium battery, and repeat step S11, otherwise, a value is selected from the intersection of the amplitude range [λ1, λ2] and the amplitude range [λ3, λ4] as the amplitude of the AC disturbance signal.

3. The method for measuring AC impedance of a battery in a composite power supply power system according to claim 2, wherein in step S11, the amplitude range [λ1, λ2] of the disturbance signal of the fuel cell is [a*2%, a*10%], wherein 'a' represents the DC output signal of the fuel cell.

4. The method for measuring AC impedance of a battery in a composite power supply power system according to claim 2, wherein in step S12, the amplitude range [λ3, λ4] of the disturbance signal of the lithium battery is [b*2%, b*10%], wherein 'b' represents the DC output signal of the lithium battery.

5. The method for measuring AC impedance a battery in a composite power supply power system according to claim 1, wherein in said step S2, the real-time acquiring the current signal and the voltage signal of the fuel cell is specifically: acquiring the current signal $I_{fuelcell}$ and an overall voltage signal $V_{fuelcell}$ of the fuel cell are acquired, and acquiring voltage signals $V_{fuelcellp}$ of single cells to be measured in the fuel cell, 0<p<n+1, n being a number of the single cells in the fuel cell; the real-time acquiring the current signal and voltage signal of the lithium battery are collected in real time as follows is specifically: acquiring the current signal $I_{lithium}$ and an overall voltage signal $V_{lithium}$ of the lithium battery, and acquiring voltage signals $V_{lithiumq}$ of single cells to be measured in the lithium battery, 0<q<m+1, m being a number of the single cells in the lithium battery.

6. The method for measuring AC impedance of a battery in a composite power supply power system according to claim 1, wherein in said step S3, the real-time demand power $P_{loaddemand}$ is calculated by the formula:

$$P_{loaddemand} = P_{DCDC-out} + P_{lithiumbattery}$$

$$P_{DCDC-out} = \eta P_{DCDC-in}$$

$$P_{DCDC-in} = P_{fuelcell}$$

where $P_{loaddemand}$ is the real-time demand power of the load, $P_{DCDC-out}$ is an output power of the DC/DC voltage converter, $P_{lithiumbattery}$ is an output power of the lithium battery, η is a conversion efficiency of the DC/DC voltage converter, $P_{DCDC-in}$ is an input power of the DC/DC voltage converter, and $P_{fuelcell}$ is an output power of the fuel cell.

7. The method for measuring AC impedance of a battery in a composite power supply power system according to claim 1, characterized in that in said step S3, the preset stability threshold is 1%.

8. The method for measuring AC impedance of a battery in a composite power supply power system according to claim 5, wherein in said step S3 and step S4, a formula for calculating the impedance of the fuel cell, an impedance of the single cells to be measured in the fuel cell, the impedance of the lithium battery and an impedance of the single cells to be measured in the lithium battery are specifically:

$$Z(\omega) = \frac{V_A}{I_A} e^{j(\theta_1 - \theta_2)}$$

$$V(t) = V_D + V_A \sin(\omega t + \theta_1)$$

$$I(t) = I_D + I_A \sin(\omega t + \theta_2)$$

wherein, $Z(\omega)$ represents the impedance, V(t) represents a collected voltage signal, $V_D$ represents a DC voltage signal in the collected voltage signal, $V_A$ represents an AC voltage signal in the collected voltage signal, I(t) represents a collected current signal, $I_D$ represents a DC current signal in the collected current signal, $I_A$ represents an AC current signal in the collected current signal, ω represents a frequency of the AC voltage signal and a frequency of the AC current signal, t represents a time, and $\theta_1$ and $\theta_2$ represent an initial phase of the AC voltage signal and an initial phase of the AC current signal, respectively.

9. The method for measuring AC impedance of a battery in a composite power supply power system according to claim 1, wherein in said step S3, the preset time length T1 is 2 seconds.

10. The method for measuring AC impedance of a battery in a composite power supply power system according to claim 1, wherein in said step S4, the preset time length T2 is 5 seconds.

* * * * *